(12) United States Patent
Dong et al.

(10) Patent No.: US 11,664,408 B2
(45) Date of Patent: May 30, 2023

(54) LIGHT EMITTING MODULE AND DRIVING METHOD THEREOF, AND DISPLAYING DEVICE

(71) Applicants: Beijing BOE Optoelectronics Technology Co., Ltd., Beijing (CN); BOE Technology Group Co., Ltd., Beijing (CN)

(72) Inventors: Xiaoqiao Dong, Beijing (CN); Rui Han, Beijing (CN); Xiaoxia Wang, Beijing (CN); Qi Qi, Beijing (CN); Jie Yu, Beijing (CN); Meng Li, Beijing (CN); Yaoyao Wang, Beijing (CN); Chunhua Wang, Beijing (CN); Tielei Zhao, Beijing (CN); Pengtao Li, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 27 days.

(21) Appl. No.: 17/328,168

(22) Filed: May 24, 2021

(65) Prior Publication Data
US 2022/0130892 A1    Apr. 28, 2022

(30) Foreign Application Priority Data

Oct. 28, 2020    (CN) .......................... 202011177680.6

(51) Int. Cl.
*H01L 27/15* (2006.01)
*H01L 33/62* (2010.01)
*G09G 3/32* (2016.01)

(52) U.S. Cl.
CPC ............. *H01L 27/156* (2013.01); *G09G 3/32* (2013.01); *H01L 33/62* (2013.01); *G09G 2310/08* (2013.01)

(58) Field of Classification Search
CPC ......... H01L 27/156; H01L 33/62; G09G 3/32; G09G 2310/08
See application file for complete search history.

(56) References Cited

U.S. PATENT DOCUMENTS

2007/0296686 A1   12/2007   Yoo
2012/0175651 A1*   7/2012   Kim ...................... H01L 33/62
                                                                257/91

(Continued)

FOREIGN PATENT DOCUMENTS

CN    102858057 A    1/2013
CN    209070956 U    7/2019

(Continued)

OTHER PUBLICATIONS

Office Action dated Mar. 20, 2023, issued in counterpart CN application No. 202011177680.6, with English translation. (19 pages).

*Primary Examiner* — Kenneth B Lee, Jr.
(74) *Attorney, Agent, or Firm* — WHDA, LLP

(57) ABSTRACT

A light emitting module and a driving method thereof, and a displaying device. The light emitting module includes: a light emitting base plate, wherein the light emitting base plate includes M rows and N columns of light emitting regions, and each of the light emitting regions includes a plurality of light emitting devices that are connected in series; and a driving assembly, wherein the driving assembly includes one or more driving chips, each of the driving chips includes a plurality of first leads and a plurality of second leads, each of the first leads is connected to the first terminal of a corresponding one instance of the light emitting regions, (Continued)

and each of the second leads is connected to the second terminal of a corresponding one instance of the light emitting regions; wherein a total quantity of the second leads in the driving assembly is integer multiples of N.

15 Claims, 5 Drawing Sheets

(56) References Cited

U.S. PATENT DOCUMENTS

2012/0176565 A1 7/2012 Yu et al.
2020/0380923 A1 12/2020 Sun et al.

FOREIGN PATENT DOCUMENTS

| CN | 111653230 A | 9/2020 |
| WO | 2020/140786 A1 | 7/2020 |

* cited by examiner

LIGHT EMITTING MODULE AND DRIVING METHOD THEREOF, AND DISPLAYING DEVICE

CROSS REFERENCE TO RELEVANT APPLICATIONS

The present disclosure claims the priority of the Chinese patent application filed on Oct. 28, 2020 before the Chinese Patent Office with the application number of 202011177680.6 and the title of "LIGHT EMITTING MODULE AND DRIVING METHOD THEREOF, AND DISPLAYING DEVICE", which is incorporated herein in its entirety by reference.

TECHNICAL FIELD

The present disclosure relates to the technical field of displaying, and particularly relates to a light emitting module and a driving method thereof, and a displaying device.

BACKGROUND

With the development of displaying techniques, in order to increase the contrast of displaying devices, a light emitting base plate comprising light emitting devices may be used as the backlight source of a display panel, and, in the displaying of the display panel, the light emitting devices in the light emitting base plate may be controlled in the sub-regions, to control the emitted-light brightnesses of the light emitting devices in the light emitting regions, thereby increasing the displaying contrast of the display panel, and improving the displaying image quality.

SUMMARY

The present disclosure provides a light emitting module and a driving method thereof, and a displaying device.

The present disclosure discloses a light emitting module, wherein the light emitting module comprises:

a light emitting base plate, wherein the light emitting base plate comprises M rows and N columns of light emitting regions, each of the light emitting regions comprises a plurality of light emitting devices that are connected in series, a first terminal of each of the light emitting regions is an anode of a first instance of the light emitting devices in the light emitting region, a second terminal of each of the light emitting regions is a cathode of a last instance of the light emitting devices in the light emitting region, and both of M and N are a positive integer greater than 1; and a driving assembly, wherein the driving assembly comprises one or more driving chips, each of the driving chips comprises a plurality of first leads and a plurality of second leads, each of the first leads is connected to the first terminal of a corresponding one instance of the light emitting regions, and each of the second leads is connected to the second terminal of a corresponding one instance of the light emitting regions;

wherein a total quantity of the second leads in the driving assembly is integer multiples of N.

Optionally, each of the first leads is connected to first terminals of some or all of the light emitting regions in the corresponding row, and each of the first leads corresponds to at least one row of the light emitting regions; and each of the second leads is connected to second terminals of some or all of the light emitting regions in the corresponding column, and each of the second leads corresponds to one column of the light emitting regions.

Optionally, M is integer multiples of a quantity of the first leads comprised in each of the driving chips.

Optionally, the quantity of the first leads comprised in each of the driving chips is greater than or equal to M/8, and a product between the quantity of the first leads and a quantity of the second leads comprised in each of the driving chips is greater than or equal to $(M \times N)/8$.

Optionally, the quantity of the driving chips comprised in the driving assembly is 2;

the quantity of the first leads comprised in each of the driving chips is M/2, and the quantity of the second leads comprised in each of the driving chips is 2N;

each of the first leads is connected to first terminals of all of the light emitting regions in two corresponding neighboring rows; and each column of the light emitting regions is divided into two groups, second terminals of the light emitting regions in the same one group are connected to a same one second lead, and the second leads that are connected to the two groups of the light emitting regions are different.

Optionally, the quantity of the driving chips comprised in the driving assembly is 4;

the quantity of the first leads comprised in each of the driving chips is M/2, and the quantity of the second leads comprised in each of the driving chips is N;

each of the first leads is connected to first terminals of all of the light emitting regions in one corresponding row; and each column of the light emitting regions is divided into two groups, second terminals of the light emitting regions in the same one group are connected to a same one second lead, and the second leads that are connected to the two groups of the light emitting regions are different.

Optionally, the plurality of second leads comprised in each of the driving chips are classified into at least two types, different types of the second leads are connected in series to each other, and each of the second terminals of the light emitting regions is connected to any one of the second leads that are connected in series.

Optionally, the types into which the plurality of second leads comprised in each of the driving chips are classified are related to a maximum current value required by the light emitting base plate and a current limit of each of the second leads of the driving chips.

Optionally, the driving assembly further comprises a voltage boosting sub-assembly and a voltage dropping sub-assembly;

the voltage boosting sub-assembly is connected to an input terminal of an external power supply and the driving chips, and is configured for boosting an external-power-supply voltage supplied by the input terminal of the external power supply, to obtain a driving voltage, to supply the driving voltage to the light emitting devices in the light emitting regions via the driving chips; and the voltage dropping sub-assembly is connected to the input terminal of the external power supply and the driving chips, and is configured for dropping the external-power-supply voltage supplied by the input terminal of the external power supply, to obtain an operating voltage, and supplying the operating voltage to the driving chips, to cause the driving chips to be in an operating state.

Optionally, the driving assembly further comprises a controlling sub-assembly;

the controlling sub-assembly is connected to a time-sequence controller and the driving chips, and is configured for, according to a controlling signal sent by the time-sequence controller, controlling the driving chips to supply the driving voltage and a driving-current signal to the light emitting devices in the corresponding light emitting region; and the voltage dropping sub-assembly is further connected to the controlling sub-assembly, and is configured for supplying the operating voltage to the controlling sub-assembly, to cause the controlling sub-assembly to be in an operating state.

Optionally, the light emitting base plate comprises a glass base plate, electrode connecting lines provided on the glass base plate, and the light emitting devices connected to the electrode connecting lines; and the electrode connecting lines are further connected to the driving chips.

Optionally, the electrode connecting lines include anode connecting lines and cathode connecting lines, and the anode connecting lines and the cathode connecting lines are insulated from each other; and the first terminal of each of the light emitting regions is connected to one of the anode connecting lines, the second terminal of each of the light emitting regions is connected to one of the cathode connecting lines, and all of the anode connecting lines and the cathode connecting lines are connected to the driving chips via an FPC board.

Optionally, the light emitting devices are Mini LED devices or Micro LED devices.

The present disclosure further discloses a light-emitting-module driving method, wherein the method is for driving the light emitting module stated above, and the method comprises:

determining pixel data of pixel units in displaying sub-regions corresponding to each of the light emitting regions; and according to the pixel data, sending a controlling signal to the driving chips, to control the light emitting devices in each of the light emitting regions with respect to whether to emit light and an emitted-light brightness.

The present disclosure further discloses a calculating and processing device, wherein the calculating and processing device comprises:

a memory storing a computer-readable code; and one or more processors, wherein when the computer-readable code is executed by the one or more processors, the calculating and processing device implements the light-emitting-module driving method stated above.

The present disclosure further discloses a computer program, wherein the computer program comprises a computer-readable code, and when the computer-readable code is executed on a calculating and processing device, the computer-readable code causes the calculating and processing device to implement the light-emitting-module driving method stated above.

The present disclosure further discloses a computer-readable medium, wherein the computer-readable medium stores the computer program described above.

The present disclosure further discloses a displaying device, wherein the displaying device comprises the light emitting module stated above.

Optionally, the displaying device further comprises a display panel and a time-sequence controller, and the display panel is located on a light exiting side of the light emitting module; and the time-sequence controller is connected to the display panel and the light emitting module.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the related art, the figures that are required to describe the embodiments or the related art will be briefly introduced below. Apparently, the figures that are described below are merely embodiments of the present disclosure, and a person skilled in the art can obtain other figures according to these figures without paying creative work.

DETAILED DESCRIPTION

In order to make the above purposes, features and advantages of the present disclosure more apparent and understandable, the present disclosure will be described in further detail below with reference to the drawings and the particular embodiments. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

Figure 1:
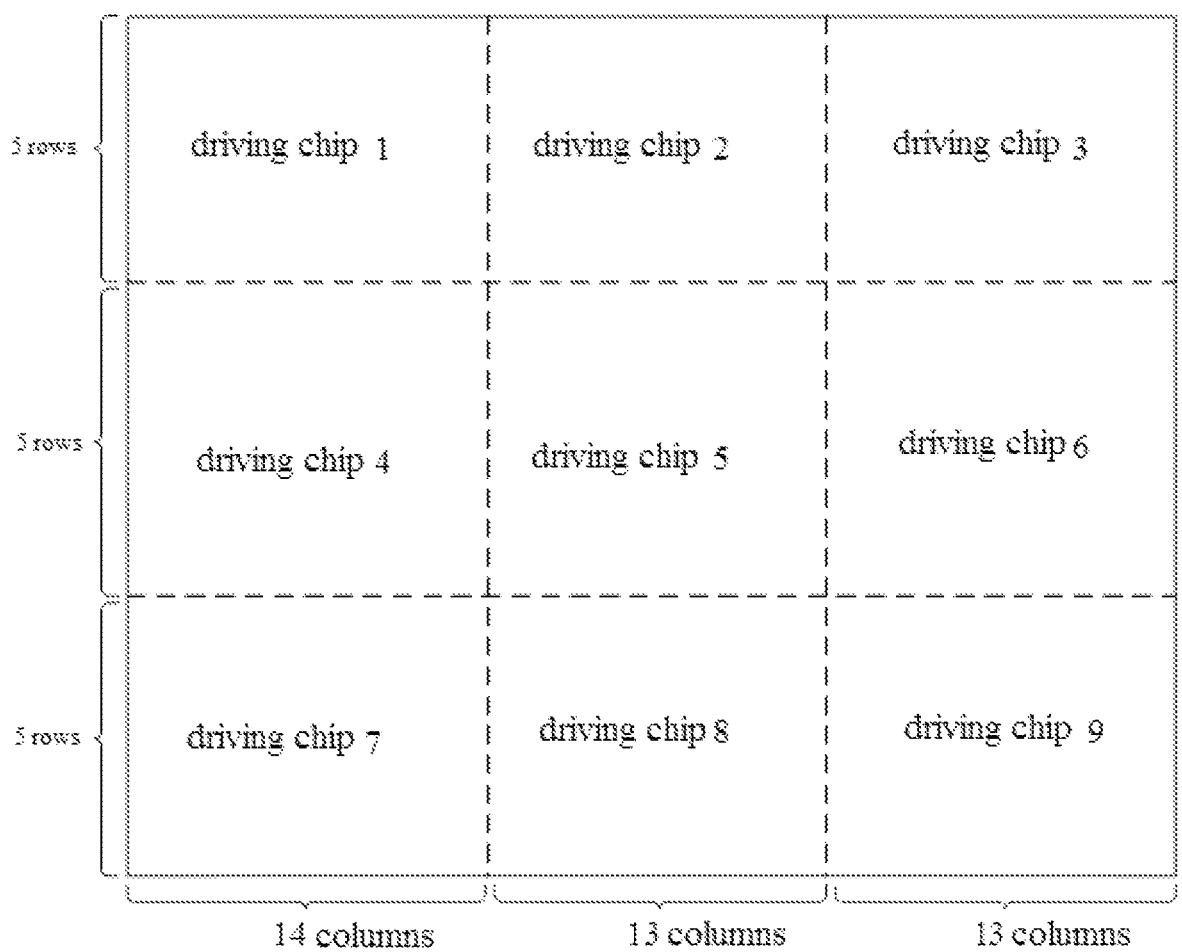
FIG. 1 shows a schematic diagram of a light emitting module in the related art.

As shown in FIG. 1, in the related art, the row quantity of the light emitting regions divided in the light emitting base plate is 15, the column quantity of the light emitting regions divided in the light emitting base plate is 40, the quantity of the first leads MUX comprised in each of the driving chips is 5, and the quantity of the second leads CH comprised in each of the driving chips is 16; in other words, the specification of each of the driving chips is 5MUX & 16CH. Therefore, it is required to provide 9 driving chips to drive the light emitting regions in the light emitting base plate to emit light, and the 9 driving chips are a driving chip 1, a driving chip 2, a driving chip 3, a driving chip 4, a driving chip 5, a driving chip 6, a driving chip 7, a driving chip 8 and a driving chip 9.

5 first leads MUX comprised in the driving chip 1, 5 first leads MUX comprised in the driving chip 2 and 5 first leads MUX comprised in the driving chip 3 are individually connected to the light emitting regions in the 1st row to the 5th row. 5 first leads MUX comprised in the driving chip 4, 5 first leads MUX comprised in the driving chip 5 and 5 first leads MUX comprised in the driving chip 6 are individually connected to the light emitting regions in the 6th row to the 10th row. 5 first leads MUX comprised in the driving chip 7, 5 first leads MUX comprised in the driving chip 8 and 5 first leads MUX comprised in the driving chip 9 are individually connected to the light emitting regions in the 11th row to the 15th row.

Furthermore, 14 second leads CH among 16 second leads CH comprised in the driving chip 1, 14 second leads CH among 16 second leads CH comprised in the driving chip 4 and 14 second leads CH among 16 second leads CH comprised in the driving chip 7 are individually connected to the light emitting regions in the 1st column to the 14th column. 13 second leads CH among 16 second leads CH comprised in the driving chip 2, 13 second leads CH among 16 second leads CH comprised in the driving chip 5 and 13 second leads CH among 16 second leads CH comprised in the driving chip 8 are individually connected to the light emitting regions in the 15th column to the 27th column. 13 second leads CH among 16 second leads CH comprised in the driving chip 3, 13 second leads CH among 16 second leads CH comprised in the driving chip 6 and 13 second leads CH among 16 second leads CH comprised in the driving chip 9 are individually connected to the light emitting regions in the 28th column to the 40th column.

It can be seen that each of the driving chip 1, the driving chip 4 and the driving chip 7 has 2 second leads CH that are not connected to a light emitting region; in other words, each of the driving chip 1, the driving chip 4 and the driving chip 7 has 2 second leads CH that are in the idle state. Each of the driving chip 2, the driving chip 5, the driving chip 8, the driving chip 3, the driving chip 6 and the driving chip 9 has 3 second leads CH that are not connected to a light emitting region; in other words, each of the driving chip 2, the driving chip 5, the driving chip 8, the driving chip 3, the driving chip 6 and the driving chip 9 has 3 second leads CH that are in the idle state. In other words, the leads of each of the driving chips are not sufficiently utilized, which results in that, in order to drive light emitting regions of 600 sub-regions, 9 driving chips are required to realize sub-region driving. The high quantity of the driving chips results in a high cost of the light emitting module.

Therefore, in the embodiments of the present disclosure, by reasonably setting the quantities of the rows and the columns of the light emitting regions divided in the light emitting base plate, to cause the total quantity of the second leads in the driving assembly to be integer multiples of the column quantity of the light emitting regions, it is ensured that all of the second leads of each of the driving chips can be connected to the light emitting regions, or, in other words, it is ensured that all of the second leads of each of the driving chips are in the usage state, and none of the second leads is in an idle state, which can increase the utilization rate of the leads of the driving chips. Furthermore, as the utilization rate of the leads of the driving chips is increased, the quantity of the driving chips in the driving assembly can be correspondingly reduced, thereby reducing the cost of the light emitting module.

Figure 2:
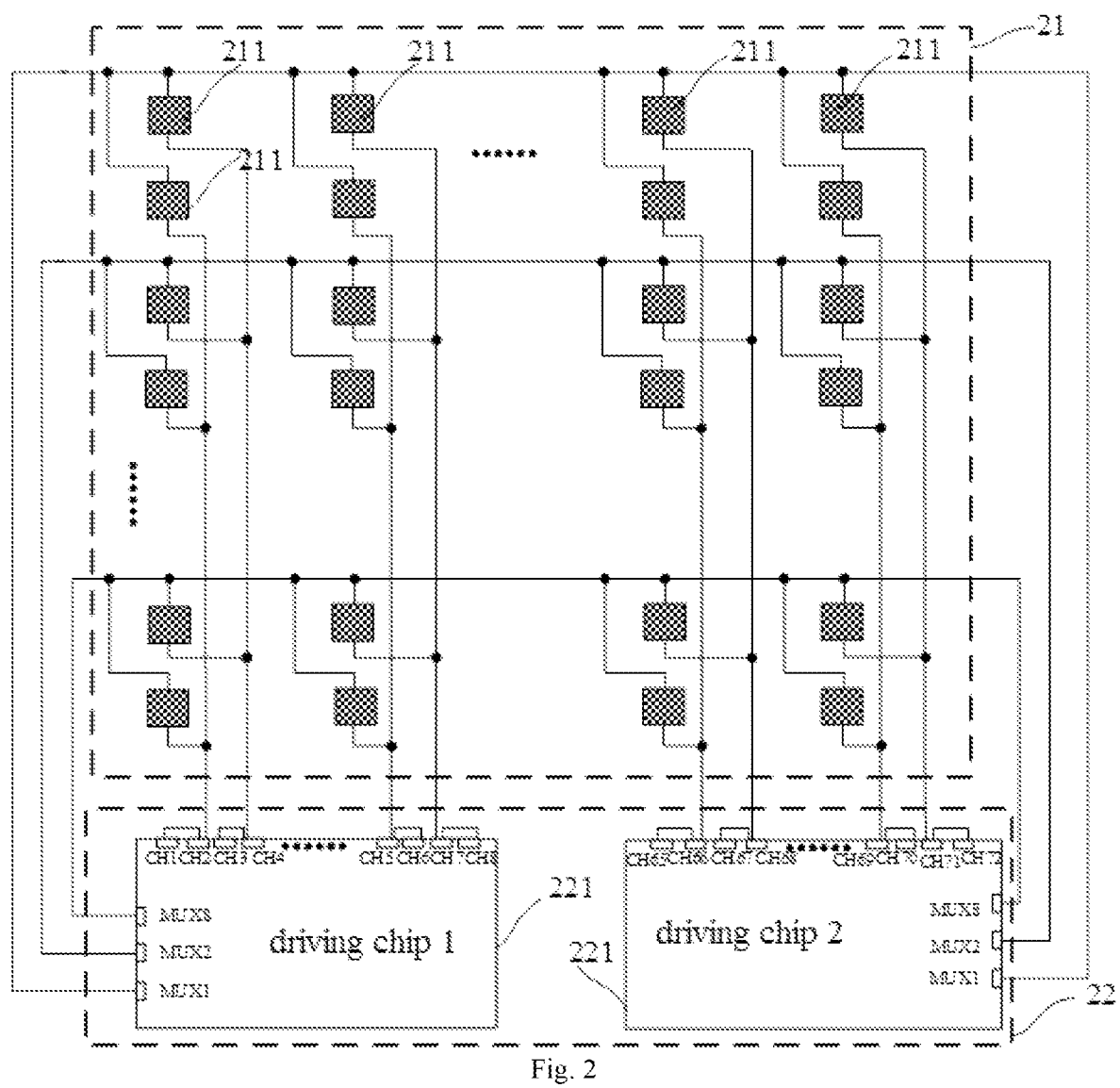
FIG. 2 shows a schematic circuit diagram of a light emitting module according to an embodiment of the present disclosure.
Figure 3:
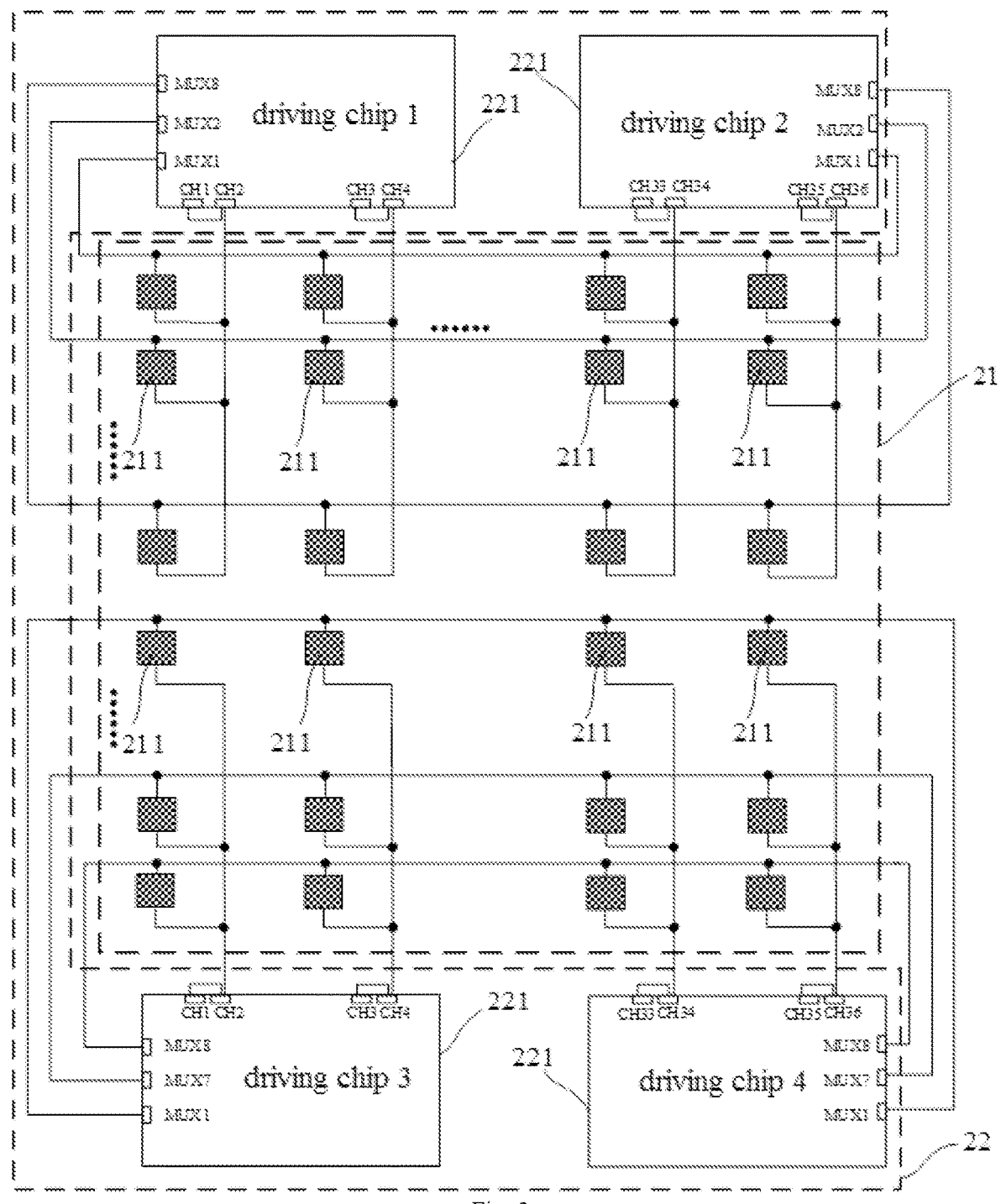
FIG. 3 shows a schematic circuit diagram of another light emitting module according to an embodiment of the present disclosure.

Referring to FIG. 2, FIG. 2 shows a schematic circuit diagram of a light emitting module according to an embodiment of the present disclosure. FIG. 3 shows a schematic circuit diagram of another light emitting module according to an embodiment of the present disclosure.

An embodiment of the present disclosure provides a light emitting module, comprising a light emitting base plate 21 and a driving assembly 22. The light emitting base plate 21 comprises M rows and N columns of the light emitting regions 211, each of the light emitting regions 211 comprises a plurality of light emitting devices that are connected in series, the first terminal of each of the light emitting regions 211 is an anode of a first light emitting device in the light emitting regions 211, the second terminal of each of the light emitting regions 211 is a cathode of a last light emitting device in the light emitting regions 211, and both of M and N are a positive integer greater than 1. The driving assembly 22 comprises one or more driving chips 221, each of the driving chips 221 comprises a plurality of first leads and a plurality of second leads, each of the first leads is connected to the first terminal of a corresponding one light emitting region 211, and each of the second leads is connected to the second terminal of the corresponding one light emitting region 211. The total quantity of the second leads in the driving assembly 22 is integer multiples of N.

In the practical product, according to the quantities of the first leads and the second leads of each of the driving chips 221, the light emitting base plate 21 is divided into regions, to obtain the M rows and N columns of the light emitting regions 211, wherein each of the light emitting regions 211 comprises a plurality of light emitting devices that are connected in series.

Figure 4:
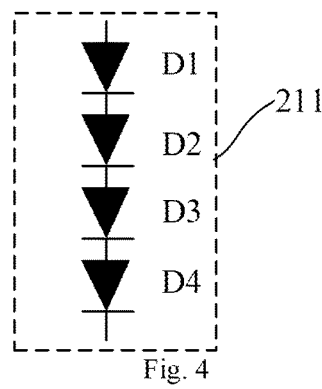
FIG. 4 shows a schematic structural diagram of the light emitting devices in a light emitting region according to an embodiment of the present disclosure.

As shown in FIG. 4, the quantity of the light emitting devices comprised in each of the light emitting regions 211 is 4, which are a light emitting device D1, a light emitting device D2, a light emitting device D3 and a light emitting device D4. The anode of the light emitting device D1 is the first terminal of the light emitting region 211, the cathode of the light emitting device D1 is connected to the anode of the light emitting device D2, the cathode of the light emitting device D2 is connected to the anode of the light emitting device D3, the cathode of the light emitting device D3 is connected to the anode of the light emitting device D4, and the cathode of the light emitting device D4 is the second terminal of the light emitting region 211.

Certainly, the quantity of the light emitting devices comprised in each of the light emitting regions 211 is not limited to 4, and may also be 3, 5 and so on, which is not limited in the embodiments of the present disclosure.

Furthermore, the driving assembly 22 comprises one or more driving chips 221, and each of the driving chips 221 comprises a plurality of first leads and a plurality of second leads, wherein the first leads refer to the leads of MUX1, MUX2, . . . , and MUX8 in FIGS. 2 and 3, and the second leads refer to the leads of CH1, CH2, CH3, CH4, . . . , and CH72 of FIGS. 2 and 3.

The first leads of each of the driving chips 221 are used for supplying a driving voltage to the light emitting devices in the light emitting region 211 that is correspondingly connected, to cause the light emitting devices in the corresponding light emitting region 211 to be in the operating state. The second leads of each of the driving chips 221 are used for supplying a driving-current signal to the light emitting devices in the light emitting region 211 that is correspondingly connected, and, according to the driving-current signal, controlling the light emitting devices in the corresponding light emitting region 211 to emit light. Furthermore, the emitted-light brightnesses of the light emitting devices in each of the light emitting regions 211 are related to the magnitudes of the currents outputted by the second leads of the driving chips 221 that are correspondingly connected.

When each of the light emitting regions 211 comprises the 4 light emitting devices shown in FIG. 4, each of the first leads is connected to the anodes of the light emitting devices D1 in the corresponding light emitting region 211, and each of the second leads is connected to the cathodes of the light emitting devices D4 in the corresponding light emitting region 211.

In the practical product, after the light emitting base plate 21 is divided into regions, to obtain the M rows and N columns of the light emitting regions 211, it is required to, according to the column quantity N of the light emitting regions 211, and the quantity of the second leads comprised in each of the driving chips 221, determine the total quantity of the driving chips 221 in the driving assembly 22, to cause the total quantity of the second leads in the driving assembly 22 to be integer multiples of the column quantity N of the light emitting regions 211. The total quantity of the second leads in the driving assembly 22 refers to the sum of the quantities of the second leads of all of the driving chips 221 comprised in the driving assembly 22.

For example, the light emitting base plate 21 is divided into regions, to obtain 16 rows and 36 columns of the light emitting regions 211, or, in other words, M is 16 and N is 36, and the quantity of the second leads comprised in each of the driving chips 221 is 72. Accordingly, it is determined that the total quantity of the driving chips 221 in the driving assembly 22 is 2, so that the total quantity of the second leads in the driving assembly 22 is 4 times the column quantity N of the light emitting regions 211.

By reasonably setting the quantities of the rows and the columns of the light emitting regions 211 divided in the light emitting base plate 21, to cause the total quantity of the second leads in the driving assembly 22 to be integer multiples of the column quantity of the light emitting regions 211, it is ensured that all of the second leads of each of the driving chips 221 can be connected to the light emitting regions 211, or, in other words, it is ensured that all of the second leads of each of the driving chips 221 are in the usage state, and none of the second leads is in an idle state, which can increase the utilization rate of the leads of the driving chips 221. Furthermore, as the utilization rate of the leads of the driving chips 221 is increased, the quantity of the driving chips 221 in the driving assembly 22 can be correspondingly reduced, thereby reducing the cost of the light emitting module.

In an embodiment of the present disclosure, each of the first leads is connected to the first terminals of some or all of the light emitting regions 211 in the corresponding row, and each of the first leads corresponds to at least one row of the light emitting regions 211. Each of the second leads is connected to the second terminals of some or all of the light emitting regions 211 in the corresponding column, and each of the second leads corresponds to one column of the light emitting regions 211.

In the practical product, each of the first leads may be connected to the first terminals of all of the light emitting regions 211 located in at least one row.

As shown in FIG. 2, each of the first leads is connected to the first terminals of all of the light emitting regions 211 in two corresponding neighboring rows. The first lead MUX1 of a driving chip 1 is connected to the first terminals of all of the light emitting regions 211 in the 1st row and the 2nd row, and the first lead MUX1 of a driving chip 2 is also connected to the first terminals of all of the light emitting regions 211 in the 1st row and the 2nd row. The first lead MUX2 of the driving chip 1 is connected to the first terminals of all of the light emitting regions 211 in the 3rd row and the 4th row, and the first lead MUX2 of the driving chip 2 is also connected to the first terminals of all of the light emitting regions 211 in the 3rd row and the 4th row. The rest can be done in the same manner. The first lead MUX8 of the driving chip 1 is connected to the first terminals of all of the light emitting regions 211 in the 15th row and the 16th row, and the first lead MUX8 of the driving chip 2 is also connected to the first terminals of all of the light emitting regions 211 in the 15th row and the 16th row.

As shown in FIG. 3, each of the first leads is connected to the first terminals of all of the light emitting regions 211 in one corresponding row. The first lead MUX1 of the driving chip 1 is connected to the first terminals of all of the light emitting regions 211 in the 1st row, and the first lead MUX1 of the driving chip 2 is also connected to the first terminals of all of the light emitting regions 211 in the 1st row. The first lead MUX2 of the driving chip 1 is connected to the first terminals of all of the light emitting regions 211 in the 2nd row, and the first lead MUX2 of the driving chip 2 is also connected to the first terminals of all of the light emitting regions 211 in the 2nd row. The rest can be done in the same manner. The first lead MUX8 of the driving chip 1 is connected to the first terminals of all of the light emitting regions 211 in the 8th row, and the first lead MUX8 of the driving chip 2 is also connected to the first terminals of all of the light emitting regions 211 in the 8th row. The first lead MUX1 of a driving chip 3 is connected to the first terminals of all of the light emitting regions 211 in the 9th row, and the first lead MUX1 of a driving chip 4 is also connected to the first terminals of all of the light emitting regions 211 in the 9th row. The rest can be done in the same manner. The first lead MUX7 of the driving chip 3 is connected to the first terminals of all of the light emitting regions 211 in the 15th row, and the first lead MUX7 of the driving chip 4 is also connected to the first terminals of all of the light emitting regions 211 in the 15th row. The first lead MUX8 of the driving chip 3 is connected to the first terminals of all of the light emitting regions 211 in the 16th row, and the first lead MUX8 of the driving chip 4 is also connected to the first terminals of all of the light emitting regions 211 in the 16th row.

Certainly, each of the first leads may also be connected to the first terminals of some of the light emitting regions 211 in the corresponding row. For example, in FIG. 2, alternatively, the first lead MUX1 of the driving chip 1 is connected to the first terminals of the light emitting regions 211 located in the 1st column to the 18th column in the 1st row and of the light emitting regions 211 located in the 1st column to the 18th column in the 2nd row, and the first lead MUX1 of the driving chip 2 is connected to the first terminals of the light emitting regions 211 located in the 19th column to the 36th column in the 1st row and of the light emitting regions 211 located in the 19th column to the 36th column in the 2nd row. In FIG. 3, alternatively, the first lead MUX1 of the driving chip 1 is connected to the first terminals of the light emitting regions 211 located in the 1st column to the 18th column in the 1st row, and the first lead MUX1 of the driving chip 2 is connected to the first terminals of the light emitting regions 211 located in the 19th column to the 36th column in the 1st row.

In the practical product, each of the second leads may be connected to the second terminals of some of the light emitting regions 211 in the one corresponding column.

As shown in FIG. 2, each of the second leads is connected to the second terminals of the light emitting regions 211 located in the odd-number rows or the even-number rows in the one corresponding column. The second lead CH2 of the driving chip 1 is connected to the second terminals of the light emitting regions 211 located in the even-number rows in the 1st column, and, because the second lead CH1 of the driving chip 1 is connected in series to the second lead CH2 of the driving chip 1, the second lead CH1 of the driving chip 1 is also connected to the second terminals of the light emitting regions 211 located in the even-number rows in the 1st column, via the second lead CH2. The second lead CH4 of the driving chip 1 is connected to the second terminals of the light emitting regions 211 located in the odd-number rows in the 1st column, and, because the second lead CH3 of the driving chip 1 is connected in series to the second lead CH4 of the driving chip 1, the second lead CH3 of the driving chip 1 is also connected to the second terminals of the light emitting regions 211 located in the odd-number rows in the 1st column, via the second lead CH4. The second lead CH5 of the driving chip 1 is connected to the second terminals of the light emitting regions 211 located in the even-number rows in the 2nd column, and, because the second lead CH5 of the driving chip 1 is connected in series to the second lead CH6 of the driving chip 1, the second lead CH6 of the driving chip 1 is also connected to the second terminals of the light emitting regions 211 located in the even-number rows in the 2nd column. The second lead CH7 of the driving chip 1 is connected to the second terminals of the light emitting regions 211 located in the odd-number rows in the 2nd column, and, because the second lead CH8 of the driving chip 1 is connected in series to the second lead CH7 of the driving chip 1, the second lead CH8 of the driving chip 1 is also connected to the second terminals of the light emitting regions 211 located in the odd-number rows in the 2nd column. The rest can be done in the same manner. The second lead CH66 of the driving chip 2 is connected to the second terminals of the light emitting regions 211 located in the even-number rows in the 35th column, and, because the second lead CH65 of the driving chip 2 is connected in series to the second lead CH66 of the driving chip 2, the second lead CH65 of the driving chip 2 is also connected to the second terminals of the light emitting regions 211 located in the even-number rows in the 35th column, via the second lead CH66. The second lead CH68 of the driving chip 2 is connected to the second terminals of the light emitting regions 211 located in the odd-number rows in the 35th column, and, because the second lead CH67 of the driving chip 2 is connected in series to the second lead CH68 of the driving chip 2, the second lead CH67 of the driving chip 2 is also connected to the second terminals of the light emitting regions 211 located in the odd-number rows in the 35th column, via the second lead CH68. The second lead CH69 of the driving chip 2 is connected to the second terminals of the light emitting regions 211 located in the even-number rows in the 36th column, and, because the second lead CH70 of the driving chip 2 is connected in series to the second lead CH69 of the driving chip 2, the second lead CH70 of the driving chip 2 is also connected to the second terminals of the light emitting regions 211 located in the even-number rows in the 36th column, via the second lead CH69. The second lead CH71 of the driving chip 2 is connected to the second terminals of the light emitting regions 211 located in the odd-number rows in the 36th column, and, because the second lead CH72 of the driving chip 2 is connected in series to the second lead CH71 of the driving chip 2, the second lead CH72 of the driving chip 2 is also connected to the second terminals of the light emitting regions 211 located in the odd-number rows in the 36th column, via the second lead CH71.

As shown in FIG. 3, each of the second leads is connected to the second terminals of the light emitting regions 211 located in the 1st row to the (M/2)-th row in the one corresponding column, or connected to the second terminals of the light emitting regions 211 located in the (M/2+1)-th row to the M-th row in the one corresponding column. The second lead CH2 of the driving chip 1 is connected to the second terminals of the light emitting regions 211 located in the 1st row to the 8th row in the 1st column, and the second lead CH2 of the driving chip 1 is connected in series to the second lead CH1 of the driving chip 1, while the second lead CH2 of the driving chip 3 is connected to the second terminals of the light emitting regions 211 located in the 9th row to the 16th row in the 1st column, and the second lead CH2 of the driving chip 3 is connected in series to the second lead CH1 of the driving chip 3. The second lead CH4 of the driving chip 1 is connected to the second terminals of the light emitting regions 211 located in the 1st row to the 8th row in the 2nd column, and the second lead CH4 of the driving chip 1 is connected in series to the second lead CH3 of the driving chip 1, while the second lead CH4 of the driving chip 3 is connected to the second terminals of the light emitting regions 211 located in the 9th row to the 16th row in the 2nd column, and the second lead CH4 of the driving chip 3 is connected in series to the second lead CH3 of the driving chip 3. The rest can be done in the same manner. The second lead CH34 of the driving chip 2 is connected to the second terminals of the light emitting regions 211 located in the 1st row to the 8th row in the 35th column, and the second lead CH34 of the driving chip 2 is connected in series to the second lead CH33 of the driving chip 2, while the second lead CH34 of the driving chip 4 is connected to the second terminals of the light emitting regions 211 located in the 9th row to the 16th row in the 35th column, and the second lead CH34 of the driving chip 4 is connected in series to the second lead CH33 of the driving chip 4. The second lead CH36 of the driving chip 2 is connected to the second terminals of the light emitting regions 211 located in the 1st row to the 8th row in the 36th column, and the second lead CH36 of the driving chip 2 is connected in series to the second lead CH35 of the driving chip 2, while the second lead CH36 of the driving chip 4 is connected to the second terminals of the light emitting regions 211 located in the 9th row to the 16th row in the 36th column, and the second lead CH36 of the driving chip 4 is connected in series to the second lead CH35 of the driving chip 4.

Certainly, each of the second leads may be connected to the second terminals of all of the light emitting regions 211 in the one corresponding column. For example, in FIG. 3, alternatively, the second lead CH2 of the driving chip 1 is connected to the second terminals of all of the light emitting regions 211 in the 1st column, and the second lead CH2 of the driving chip 3 is also connected to the second terminals of all of the light emitting regions 211 in the 1st column.

In an embodiment of the present disclosure, M is integer multiples of the quantity of the first leads comprised in each of the driving chips 221.

In other words, the row quantity M of the light emitting regions 211 obtained from the division of the light emitting base plate 21 is integer multiples of the quantity of the first leads comprised in each of the driving chips 221. For example, the row quantity M of the light emitting regions 211 obtained from the division of the light emitting base plate 21 is 1 time, 2 times, 4 times or 8 times, and so on, of the quantity of the first leads comprised in each of the driving chips 221.

By setting the row quantity M of the light emitting regions 211 to be integer multiples of the quantity of the first leads comprised in each of the driving chips 221, all of the first leads comprised in each of the driving chips 221 can be connected to the light emitting regions 211, or, in other words, it is ensured that all of the first leads of each of the driving chips 221 are in the usage state, and none of the first leads is in an idle state, which further increases the utilization rate of the leads of the driving chips 221, and reduces the quantity of the driving chips 221 in the driving assembly 22.

Particularly, the quantity of the first leads comprised in each of the driving chips 221 is greater than or equal to M/8, and the product between the quantity of the first leads and the quantity of the second leads comprised in each of the driving chips 221 is greater than or equal to (M×N)/8.

Because, M is integer multiples of the quantity of the first leads comprised in each of the driving chips 221, and the quantity of the first leads comprised in each of the driving chips 221 is greater than or equal to M/8, it may be derived that the quantity of the first leads comprised in each of the driving chips 221 is greater than or equal to M/8, and the quantity of the first leads comprised in each of the driving chips 221 is less than or equal to M.

By setting that the quantity of the first leads comprised in each of the driving chips 221 is greater than or equal to M/8, and the product between the quantity of the first leads and the quantity of the second leads comprised in each of the driving chips 221 is greater than or equal to (M×N)/8, the quantity of the driving chips 221 in the driving assembly 22 according to an embodiment of the present disclosure can be less than or equal to 8.

In an alternative embodiment of the present disclosure, as shown in FIG. 2, the quantity of the driving chips 221 comprised in the driving assembly 22 is 2. The quantity of the first leads comprised in each of the driving chips 221 is M/2, and the quantity of the second leads comprised in each of the driving chips 221 is 2N. Each of the first leads is connected to the first terminals of all of the light emitting regions 211 in two corresponding neighboring rows. Each column of the light emitting regions 211 is divided into two groups, the second terminals of the light emitting regions 211 in the same one group are connected to the same one second lead, and the second leads that are connected to the two groups of the light emitting regions 211 are different.

In this case, the row quantity M of the light emitting regions 211 obtained from the division of the light emitting base plate 21 is 2 times the quantity of the first leads comprised in each of the driving chips 221, and the total quantity of the second leads in the driving assembly 22 is 4 times the column quantity N of the light emitting regions 211.

For example, the light emitting base plate 21 comprises 16 rows and 36 columns of the light emitting regions 211, or, in other words, M is 16 and N is 36. Accordingly, the quantity of the first leads comprised in each of the driving chips 221 is 8, which are the first lead MUX1, the first lead MUX2, . . . , and the first lead MUX8, and the quantity of the second leads comprised in each of the driving chips 221 is 72, which are the second lead CH1, the second lead CH2, the second lead CH3, . . . , and the second lead CH72.

In each column of the light emitting regions 211, the light emitting regions 211 located in the odd-number rows are grouped as one group, and the light emitting regions 211 located in the even-number rows are grouped as another group. The second terminals of the light emitting regions 211 in the odd-number rows are connected to the same one second lead; for example, all of the second terminals of the light emitting regions 211 located in the odd-number rows in the 1st column are connected to the second lead CH4 of the driving chip 1. The second terminals of the light emitting regions 211 in the even-number rows are connected to the same one second lead; for example, all of the second terminals of the light emitting regions 211 located in the even-number rows in the 1st column are connected to the second lead CH2 of the driving chip 1.

When the light emitting devices in the light emitting regions 211 in the 1st row in the 1st column are to be driven to emit light, the driving chip 1 and the driving chip 2 simultaneously supply the same driving voltage via the respective first leads MUX1, whereby all of the light emitting devices in all of the light emitting regions 211 in the 1st row and the 2nd row are in the operating state. At this point, the driving chip 1 supplies a driving-current signal to the light emitting regions 211 in the odd-number rows in the 1st column via the second lead CH4, and, because, among the light emitting regions 211 in the odd-number rows in the 1st column, merely the light emitting regions 211 in the 1st row are in the operating state, the light emitting devices in the light emitting region 211 in the 1st row in the 1st column can emit light.

In another alternative embodiment of the present disclosure, as shown in FIG. 3, the quantity of the driving chips 221 comprised in the driving assembly 22 is 4. The quantity of the first leads comprised in each of the driving chips 221 is M/2, and the quantity of the second leads comprised in each of the driving chips 221 is N. Each of the first leads is connected to the first terminals of all of the light emitting regions 211 in one corresponding row. Each column of the light emitting regions 211 is divided into two groups, the second terminals of the light emitting regions 211 in the same one group are connected to the same one second lead, and the second leads that are connected to the two groups of the light emitting regions 211 are different.

In this case, the row quantity M of the light emitting regions 211 obtained from the division of the light emitting base plate 21 is 2 times the quantity of the first leads comprised in each of the driving chips 221, and the total quantity of the second leads in the driving assembly 22 is 4 times the column quantity N of the light emitting regions 211.

For example, the light emitting base plate 21 comprises 16 rows and 36 columns of the light emitting regions 211, or, in other words, M is 16 and N is 36. Accordingly, the quantity of the first leads comprised in each of the driving chips 221 is 8, which are the first lead MUX1, the first lead MUX2, . . . , and the first lead MUX8, and the quantity of the second leads comprised in each of the driving chips 221 is 36, which are the second lead CH1, the second lead CH2, the second lead CH3, . . . , and the second lead CH36.

In each column of the light emitting regions 211, the light emitting regions 211 located in the 1st row to the (M/2)-th row are grouped as one group, and the light emitting regions 211 located in the (M/2+1)-th row to the M-th row are grouped as another group. The second terminals of the light emitting regions 211 in the 1st row to the (M/2)-th row are connected to the same one second lead; for example, all of the second terminals of the light emitting regions 211 located in the 1st row to the 8th row in the 1st column are connected to the second lead CH2 of the driving chip 1. The second terminals of the light emitting regions 211 in the (M/2+1)-th row to the M-th row are connected to the same one second lead; for example, all of the second terminals of the light emitting regions 211 located in the 9th row to the 16th row in the 1st column are connected to the second lead CH2 of the driving chip 3.

As shown in FIGS. 2 and 3, the plurality of second leads comprised in each of the driving chips 221 are classified into at least two types, different types of the second leads are connected in series to each other, and each of the second terminals of the light emitting regions 211 is connected to any one of the second leads that are connected in series.

The types into which the plurality of second leads comprised in each of the driving chips 221 are classified are related to the maximum current value required by the light emitting base plate 21 and the current limit of each of the second leads of the driving chips 221. By connecting in series the different types of the second leads to each other, and connecting each of the second terminals of the light emitting regions 211 to any one of the second leads that are connected in series, the current value of the driving-current signal outputted by each of the second leads connected to the light emitting regions 211 can be less than its current limit.

Because the maximum current value required by each of the light emitting devices is 2.35 mA, the required voltage value is 6.15V, and each 4 of the light emitting devices are connected in series to obtain one light emitting region 211, then the maximum current value required by each of the light emitting regions 211 is 2.35 mA, and the required voltage value is 24.6V. Furthermore, in FIGS. 2 and 3, because each of the driving chips 221 has 8 first leads that are connected to the light emitting regions 211, then the maximum current value required by the light emitting base plate 21 is 2.35 mA×8=18.8 mA, and the voltage value required by the light emitting base plate 21 is 24.6V.

The current limit of each of the second leads of the driving chips 221 is 10 mA, and the voltage limit of each of the first leads of the driving chips 221 is 27V. In order to ensure that the current value of the driving-current signal outputted by each of the second leads connected to the light emitting regions 211 is less than its current limit, the plurality of second leads comprised in each of the driving chips 221 are classified into two types, the different types of the second leads are connected in series to each other, or, in other words, each two of the second leads are connected in series to each other. For example, the second lead CH1 is connected in series to the second lead CH2, the second lead CH3 is connected in series to the second lead CH4, the rest can be done in the same manner, till the second lead CH71 is connected in series to the second lead CH72. Each of the second terminals of the light emitting regions 211 is connected to any one of the second leads that are connected in series, whereby the current limit of the second leads connected to the light emitting regions 211 reaches 20 mA. Moreover, the maximum current value of the driving-current signal required by the light emitting regions 211 in the light emitting base plate 21 is 18.8 mA, which is less than 20 mA, so the second leads of the driving chips 221 can support inputting the driving-current signal to the light emitting regions 211 in the light emitting base plate 21.

Certainly, the quantity of the driving chips 221 comprised in the driving assembly 22 is not limited to 2 or 4, and the quantity of the driving chips 221 comprised in the driving assembly 22 may also be 1, 3, 6, 8 and so on.

When the row quantity of the light emitting regions 211 obtained from the division of the light emitting base plate 21 is M and the column quantity is N, the quantity of the driving chips 221 comprised in the driving assembly 22 may be 1, the quantity of the first leads of the driving chips 221 is M, the quantity of the second leads of the driving chips 221 is 4N, and each of the first leads is connected to the first terminals of all of the light emitting regions 211 in one corresponding row.

For example, when the light emitting regions 211 obtained from the division of the light emitting base plate 21 have 16 rows and 36 columns, or, in other words, M is 16 and N is 36, the quantity of the driving chips 221 comprised in the driving assembly 22 may be 1, the quantity of the first leads of the driving chips 221 is 16, and the quantity of the second leads of the driving chips 221 is 144. Because each of the driving chips 221 has 16 first leads that are connected to the light emitting regions 211, then the maximum current value required by the light emitting base plate 21 is 2.35 mA×16=37.6 mA, and the current limit of each of the second leads of the driving chips 221 is 10 mA. At this point, it is required that the plurality of second leads comprised in the driving chips 221 are classified into four types, and each four of the second leads are connected in series to each other, whereby the current limit of the second leads connected to the light emitting regions 211 reaches 40 mA. At this point, the second terminals of each column of the light emitting regions 211 are connected to any one of the second leads that are connected in series, and, therefore, the quantity of the second leads of the driving chips 221 is 36×4=144.

When the row quantity of the light emitting regions 211 obtained from the division of the light emitting base plate 21 is M and the column quantity is N, the quantity of the driving chips 221 comprised in the driving assembly 22 may be 3, the quantity of the first leads comprised in each of the driving chips 221 is M/2, the quantity of the second leads comprised in each of the driving chips 221 is 4N/3, each of the first leads is connected to the first terminals of all of the light emitting regions 211 in two corresponding neighboring rows, and each of the driving chips 221 is connected to the second terminals of the light emitting regions 211 in N/3 columns; in other words, each of the driving chips 221 supports M rows and N/3 columns of the light emitting regions 211.

For example, when the light emitting regions 211 obtained from the division of the light emitting base plate 21 have 16 rows and 36 columns, or, in other words, M is 16 and N is 36, the quantity of the driving chips 221 comprised in the driving assembly 22 may be 3, the quantity of the first leads comprised in each of the driving chips 221 is 8, and the quantity of the second leads comprised in each of the driving chips 221 is 48. Because the current limit of each of the second leads of the driving chips 221 is 10 mA, it is required that each two of the second leads are connected in series to each other, whereby the current limit of the second leads connected to the light emitting regions 211 reaches 20 mA. Furthermore, because each of the first leads is connected to the first terminals of all of the light emitting regions 211 in two corresponding neighboring rows, in order to realize that each of the light emitting regions 211 can be controlled independently, each column of the light emitting regions 211 is divided into two groups, the second terminals of the light emitting regions 211 in the same one group are connected to the same one second lead, and the second leads that are connected to the two groups of the light emitting regions 211 are different. Each of the driving chips 221 is connected to the second terminals of the light emitting regions 211 in 12 columns, and, therefore, the quantity of the second leads comprised in each of the driving chips 221 is 12×2×2=48.

When the row quantity of the light emitting regions 211 obtained from the division of the light emitting base plate 21 is M and the column quantity is N, the quantity of the driving chips 221 comprised in the driving assembly 22 may be 6, the quantity of the first leads comprised in each of the driving chips 221 is M/2, the quantity of the second leads comprised in each of the driving chips 221 is 2N/3, each of the first leads is connected to the first terminals of all of the light emitting regions 211 in one corresponding row, and each of the driving chips 221 is connected to the second terminals of the light emitting regions 211 in N/3 columns; in other words, each of the driving chips 221 supports M/2 rows and N/3 columns of the light emitting regions 211.

For example, when the light emitting regions 211 obtained from the division of the light emitting base plate 21 have 16 rows and 36 columns, or, in other words, M is 16 and N is 36, the quantity of the driving chips 221 comprised in the driving assembly 22 may be 6, the quantity of the first leads comprised in each of the driving chips 221 is 8, and the quantity of the second leads comprised in each of the driving chips 221 is 24. Because the current limit of each of the second leads of the driving chips 221 is 10 mA, it is required that each two of the second leads are connected in series to each other, whereby the current limit of the second leads connected to the light emitting regions 211 reaches 20 mA. Furthermore, each of the driving chips 221 is connected to the second terminals of the light emitting regions 211 in 12 columns, and, therefore, the quantity of the second leads comprised in each of the driving chips 221 is 12×2=24.

When the row quantity of the light emitting regions 211 obtained from the division of the light emitting base plate 21 is M and the column quantity is N, the quantity of the driving chips 221 comprised in the driving assembly 22 may be 8, the quantity of the first leads comprised in each of the driving chips 221 is M/2, the quantity of the second leads comprised in each of the driving chips 221 is N/2, each of the first leads is connected to the first terminals of all of the light emitting regions 211 in one corresponding row, and each of the driving chips 221 is connected to the second terminals of the light emitting regions 211 in N/4 columns; in other words, each of the driving chips 221 supports M/2 rows and N/4 columns of the light emitting regions 211.

For example, when the light emitting regions 211 obtained from the division of the light emitting base plate 21 have 16 rows and 36 columns, or, in other words, M is 16 and N is 36, the quantity of the driving chips 221 comprised in the driving assembly 22 may be 8, the quantity of the first leads comprised in each of the driving chips 221 is 8, and the quantity of the second leads comprised in each of the driving chips 221 is 18. Because the current limit of each of the second leads of the driving chips 221 is 10 mA, it is required that each two of the second leads are connected in series to each other, whereby the current limit of the second leads connected to the light emitting regions 211 reaches 20 mA. Furthermore, each of the driving chips 221 is connected to the second terminals of the light emitting regions 211 in 9 columns, and, therefore, the quantity of the second leads comprised in each of the driving chips 221 is 9×2=18.

When the row quantity of the light emitting regions 211 obtained from the division of the light emitting base plate 21 is M and the column quantity is N, the quantity of the driving chips 221 comprised in the driving assembly 22 may be 8, the quantity of the first leads comprised in each of the driving chips 221 is M/8, the quantity of the second leads comprised in each of the driving chips 221 is N, each of the first leads is connected to the first terminals of all of the light emitting regions 211 in one corresponding row, and each of the driving chips 221 is connected to the second terminals of the light emitting regions 211 in N columns; in other words, each of the driving chips 221 supports M/8 rows and N columns of the light emitting regions 211.

For example, when the light emitting regions 211 obtained from the division of the light emitting base plate 21 have 16 rows and 36 columns, or, in other words, M is 16 and N is 36, the quantity of the driving chips 221 comprised in the driving assembly 22 may be 8, the quantity of the first leads comprised in each of the driving chips 221 is 2, and the quantity of the second leads comprised in each of the driving chips 221 is 36. Because each of the driving chips 221 has 2 first leads that are connected to the light emitting regions 211, then the maximum current value required by the light emitting base plate 21 is 2.35 mA×2=4.7 mA, and the current limit of each of the second leads of the driving chips 221 is 10 mA. At this point, it is not required to connect in series the second leads, and each of the driving chips 221 is connected to the second terminals of the light emitting regions 211 in 36 columns. Therefore, the quantity of the second leads comprised in each of the driving chips 221 is 36.

In conclusion, in the embodiments of the present disclosure, the light emitting base plate 21 may be divided into the light emitting regions 211 in 16 rows and 36 columns; in other words, the light emitting base plate 21 comprises 576 light emitting regions 211. As compared with the 600 light emitting regions that are divided shown in FIG. 1, the quantity of the light emitting regions 211 is not reduced to a large extent. However, the quantity of the driving chips 221 that drive the light emitting regions 211 in the 16 rows and the 36 columns to individually emit light is less than or equal to 8, and the quantity is less than the quantity, 9, of the corresponding driving chips in FIG. 1. Therefore, the embodiments of the present disclosure, by increasing the utilization rate of the first leads and the second leads of each of the driving chips 221, reduce the quantity of the required driving chips 221, thereby reducing the cost.

Figure 5:
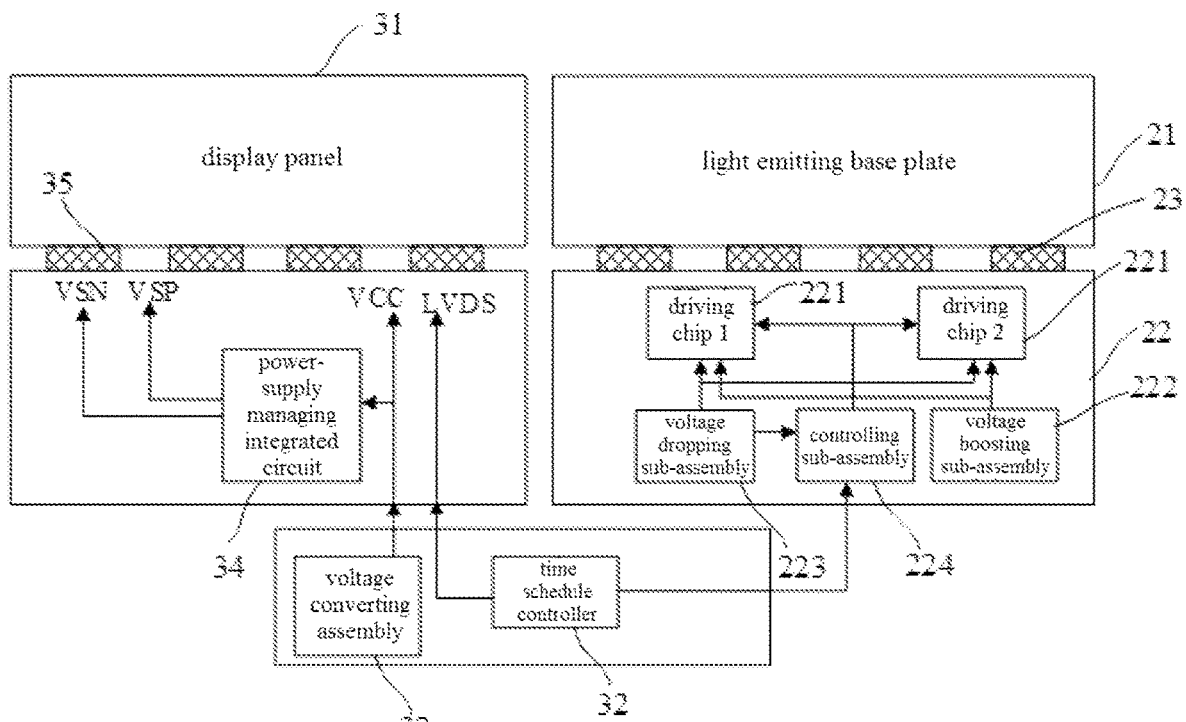
FIG. 5 shows a circuit-structure diagram of the displaying device according to an embodiment of the present disclosure.

In an embodiment of the present disclosure, as shown in FIG. 5, the driving assembly 22 further comprises a voltage boosting sub-assembly 222 and a voltage dropping sub-assembly 223. The voltage boosting sub-assembly 222 is connected to the input terminal of an external power supply and the driving chips 221, and is configured for boosting an external-power-supply voltage supplied by the input terminal of the external power supply, to obtain a driving voltage, to supply the driving voltage to the light emitting devices in the light emitting regions 211 via the driving chips 221. The voltage dropping sub-assembly 223 is connected to the input terminal of the external power supply and the driving chips 221, and is configured for dropping the external-power-supply voltage supplied by the input terminal of the external power supply, to obtain an operating voltage, and supplying the operating voltage to the driving chips 221, to cause the driving chips 221 to be in the operating state.

The external-power-supply voltage supplied by the input terminal of the external power supply is 12V. The voltage boosting sub-assembly 222 boosts the external-power-supply voltage of 12V supplied by the input terminal of the external power supply, and the voltage value of the obtained driving voltage is 25V. The voltage boosting sub-assembly 222 supplies the driving voltage to the driving chips 221. The driving chips 221, according to a received controlling signal sent by a time-sequence controller, supply the driving voltage to the light emitting devices in the corresponding light emitting region 211, to cause the light emitting devices in the light emitting regions 211 to be in the operating state.

Moreover, the voltage dropping sub-assembly 223 drops the external-power-supply voltage of 12V supplied by the input terminal of the external power supply, and the voltage value of the obtained operating voltage is 3.3V. The voltage dropping sub-assembly 223 supplies the operating voltage to the driving chips 221, whereby the driving chips 221 can operate normally.

Optionally, the driving assembly 22 further comprises a controlling sub-assembly 224. The controlling sub-assembly 224 is connected to the time-sequence controller and the driving chips 221, and is configured for, according to a controlling signal sent by the time-sequence controller, controlling the driving chips 221 to supply the driving voltage and a driving-current signal to the light emitting devices in the corresponding light emitting region 211. The voltage dropping sub-assembly 223 is further connected to the controlling sub-assembly 224, and is configured for supplying the operating voltage to the controlling sub-assembly 224, to cause the controlling sub-assembly 224 to be in the operating state.

Particularly, the driving assembly 22 is provided with the controlling sub-assembly 224. The time-sequence controller sends the controlling signal to the controlling sub-assembly 224 in the driving assembly 22. The controlling sub-assembly 224, according to the controlling signal, controls the driving chips 221 to supply the driving voltage to the light emitting devices in the corresponding light emitting region 211 via the first leads, and controls the driving chips 221 to supply the driving-current signal to the light emitting devices in the corresponding light emitting region 211 via the second leads, to cause the light emitting devices in the corresponding light emitting region 211 to emit light.

At this point, the voltage dropping sub-assembly 223 is further connected to the controlling sub-assembly 224. The voltage dropping sub-assembly 223, after dropping the external-power-supply voltage of 12V supplied by the input terminal of the external power supply to obtain the operating voltage of 3.3V, supplies the operating voltage to the controlling sub-assembly 224, whereby the controlling sub-assembly 224 can operate normally.

It should be noted that the driving assembly 22 may not be provided with the controlling sub-assembly 224. In this case, the time-sequence controller directly supplies the controlling signal to the driving chips 221, and the driving chips 221, according to the controlling signal, supply the driving voltage and the driving-current signal to the light emitting devices in the corresponding light emitting region 211.

In an embodiment of the present disclosure, the light emitting base plate 21 comprises a glass base plate, electrode connecting lines provided on the glass base plate, and the light emitting devices connected to the electrode connecting lines. The electrode connecting lines are further connected to the driving chips 221.

Conventional light emitting base plates employ a Flexible Printed Circuit (FPC) base plate, and the light emitting devices are provided on the FPC base plate. Moreover, the embodiments of the present disclosure employ the glass base plate, and the electrode connecting lines are provided on the glass base plate, to connect the light emitting devices and the electrode connecting lines. As compared with the FPC base plate, the glass base plate has a higher flatness, is free of splicing, has a higher processing precision, has a higher thermal conductivity, and has a better heat-dissipation property. Moreover, it can realize mass production of a high accuracy and a large size, with a cost less than that of the FPC base plate.

The electrode connecting lines are fabricated on the glass base plate. The electrode connecting lines may include anode connecting lines and cathode connecting lines, and the anode connecting lines and the cathode connecting lines are insulated from each other. The first terminal of each of the light emitting regions 211 is connected to one of the anode connecting lines, the second terminal of each of the light emitting regions 211 is connected to one of the cathode connecting lines, and all of the anode connecting lines and the cathode connecting lines in the light emitting base plate 21 are connected to the driving chips 221 via an FPC board 23. Particularly, the first terminals of the light emitting regions 211 are connected to the first leads of the driving chips 221 via the anode connecting lines and the FPC board 23, and the second terminals of the light emitting regions 211 are connected to the second leads of the driving chips 221 via the cathode connecting lines and the FPC board 23.

In an embodiment of the present disclosure, the light emitting devices are Mini Light Emitting Diode (Mini LED) devices or Micro LED devices.

In the practical product, the length of the Micro LED devices is less than 50 micrometers, and preferably, the length of the Micro LED devices is 10 micrometers to 50 micrometers. The length of the Mini LED devices is 50 micrometers to 150 micrometers, and preferably, the length of the Micro LED devices is 80 micrometers to 120 micrometers. When the light emitting devices are Mini LED devices or Micro LED devices, because the Micro LED devices and the Mini LED devices have the characteristics such as a small size and a high brightness, when the Mini LED devices or the Micro LED devices are employed as the light-emission source in the light emitting base plate 21, they provide a higher brightness, and make the light emitting base plate thinner and lighter. Furthermore, as compared with conventional LEDs, the Mini LED devices or the Micro LED devices have a better heat-dissipation property, a lower power consumption and a higher contrast, which enables the displaying devices employing the light emitting base plate to have a better image quality. Moreover, as compared with Organic Electroluminescence Displays (OLED), the Mini LED devices or the Micro LED devices have a longer life and a higher high-temperature reliability. Therefore, by using the Mini LED devices or the Micro LED devices as the light-emission source in the light emitting base plate 21, the heat-dissipation property, the contrast, the life and the high-temperature reliability of the light emitting base plate 21 can be improved, and the power consumption can be reduced.

In the embodiments of the present disclosure, by reasonably setting the quantities of the rows and the columns of the light emitting regions divided in the light emitting base plate, to cause the total quantity of the second leads in the driving assembly to be integer multiples of the column quantity of the light emitting regions, it is ensured that all of the second leads of each of the driving chips can be connected to the light emitting regions, or, in other words, it is ensured that all of the second leads of each of the driving chips are in the usage state, and none of the second leads is in an idle state, which can increase the utilization rate of the leads of the driving chips. Furthermore, as the utilization rate of the leads of the driving chips is increased, the quantity of the driving chips in the driving assembly can be correspondingly reduced, thereby reducing the cost of the light emitting module.

Figure 6:
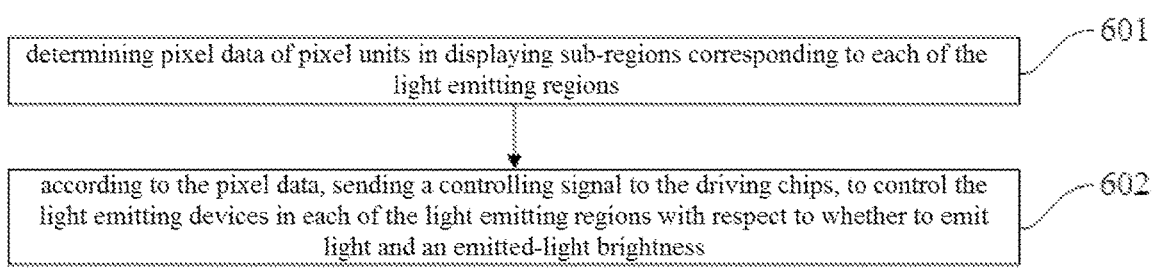
FIG. 6 shows a flow chart of the light-emitting-module driving method according to an embodiment of the present disclosure.

Referring to FIG. 6, FIG. 6 shows a flow chart of the light-emitting-module driving method according to an embodiment of the present disclosure. The method is for driving the light emitting module stated above, and may particularly comprise the following steps:

Step 601: determining pixel data of pixel units in displaying sub-regions corresponding to each of the light emitting regions.

In an embodiment of the present disclosure, after the light emitting base plate 21 has been divided to obtain the M rows and the N columns of the light emitting regions 211, the time-sequence controller determines the displaying sub-regions in the display panel corresponding to each of the light emitting regions 211, and acquires the pixel quantities of the pixel units in each of the displaying sub-regions, such as the brightness data of the pixel units.

Step 602: according to the pixel data, sending a controlling signal to the driving chips, to control the light emitting devices in each of the light emitting regions with respect to whether to emit light and an emitted-light brightness.

In an embodiment of the present disclosure, the time-sequence controller, according to the pixel data of the pixel units in each of the displaying sub-regions, generates the controlling signal, and sends the controlling signal to the driving chips 221. The driving chips 221, according to the controlling signal, control the light emitting devices in the corresponding light emitting region 211 with respect to whether to emit light and the emitted-light brightness.

When the brightness data of the pixel units in the displaying sub-region corresponding to a light emitting region 211 are 0, the light emitting devices in the light emitting region 211 are not required to emit light, and the driving chips 221, according to the controlling signal, do not supply the driving voltage and/or the driving-current signal to the light emitting region 211. When the brightness data of the pixel units in the displaying sub-region corresponding to a light emitting region 211 are not 0, the light emitting devices in the light emitting region 211 are required to emit light, and the driving chips 221, according to the controlling signal, supply the driving voltage to the light emitting devices in the corresponding light emitting region 211 via the first leads, and supply the driving-current signal to the light emitting devices in the corresponding light emitting region 211 via the second leads, to cause the light emitting devices in the light emitting region 211 to emit light.

Furthermore, the emitted-light brightnesses of the light emitting devices in the light emitting regions 211 are related to the current value of the driving-current signal outputted by the second leads of the driving chips 221 that are correspondingly connected, and the magnitude of to the current value may by controlled by regulating the duty cycle.

Therefore, when the brightness data of the pixel units in the displaying sub-region corresponding to a light emitting region 211 are higher, the current value of the driving-current signal outputted by the second leads of the driving chips 221 that are correspondingly connected is higher, whereby the emitted-light brightness of the light emitting devices in the light emitting region 211 is higher. When the brightness data of the pixel units in the displaying sub-region corresponding to a light emitting region 211 are lower, the current value of the driving-current signal outputted by the second leads of the driving chips 221 that are correspondingly connected is lower, whereby the emitted-light brightness of the light emitting devices in the light emitting region 211 is lower.

In the embodiments of the present disclosure, by reasonably setting the quantities of the rows and the columns of the light emitting regions divided in the light emitting base plate, to cause the total quantity of the second leads in the driving assembly to be integer multiples of the column quantity of the light emitting regions, it is ensured that all of the second leads of each of the driving chips can be connected to the light emitting regions, or, in other words, it is ensured that all of the second leads of each of the driving chips are in the usage state, and none of the second leads is in an idle state, which can increase the utilization rate of the leads of the driving chips. Furthermore, as the utilization rate of the leads of the driving chips is increased, the quantity of the driving chips in the driving assembly can be correspondingly reduced, thereby reducing the cost of the light emitting module.

An embodiment of the present disclosure provides a displaying device, wherein the displaying device comprises the light emitting module stated above.

The light emitting module comprises the light emitting base plate 21, the light emitting base plate 21 comprises M rows and N columns of the light emitting regions 211, and each of the light emitting regions 211 comprises a plurality of light emitting devices that are connected in series. In the practical usage, the light emitting devices in the light emitting regions 211 in the light emitting base plate 21 may be directly used as the displaying pixels of the display panel; in this case, the light emitting base plate 21 may serve as the display panel, whereby the light emitting module serves as the displaying device. The light emitting base plate 21 may also serve as a direct-type backlight source of the display panel, for supplying light rays to the display panel on its light exiting side, to further increase the contrast of the display panel; in this case, the light emitting module serves as a backlight module corresponding to the display panel.

Moreover, the particular description on the light emitting module may refer to the description on the above illustrative embodiments, and is not discussed here further.

As shown in FIG. 5, when the light emitting module according to an embodiment of the present disclosure serves as the backlight module corresponding to the display panel, the displaying device further comprises a display panel 31 and a time-sequence controller 32. The display panel 31 is located on the light exiting side of the light emitting module. The time-sequence controller 32 is connected to the display panel 31 and the light emitting module.

Particularly, the display panel 31 is located on the light exiting side of the light emitting base plate 21 in the light emitting module. When the driving assembly 22 does not comprise the controlling sub-assembly 224, the time-sequence controller 32 is directly connected to all of the driving chips 221 in the driving assembly 22; in this case, the time-sequence controller 32 directly sends the controlling signal to all of the driving chips 221, and the driving chips 221, according to the controlling signal, supply the driving voltage and the driving-current signal to the light emitting devices in the corresponding light emitting region 211. When the driving assembly 22 comprise the controlling sub-assembly 224, the time-sequence controller 32 is connected to the controlling sub-assembly 224, and then the controlling sub-assembly 224 is connected to all of the driving chips 221 in the driving assembly 22; in this case, the time-sequence controller 32 sends the controlling signal to the controlling sub-assembly 224, and the controlling sub-assembly 224, according to the controlling signal, controls the driving chips 221 to supply the driving voltage and the driving-current signal to the light emitting devices in the corresponding light emitting region 211.

The controlling signal supplied by the time-sequence controller 32 to the light emitting module is a Serial Peripheral Interface (SPI) signal, a Vertical Sync (VSYNC) signal, an Enable (EN) signal and so on. The signal supplied by the time-sequence controller 32 to the display panel 31 is a Low-Voltage Differential Signaling (LVDS).

The time-sequence controller 32, simultaneously when driving the display panel 31 to display, controls the driving chips 221 in the light emitting module to, according to the degrees of the brightnesses of the displaying sub-regions in the display panel 31, control in real time the light emitting devices in the corresponding light emitting region 211 with respect to whether to emit light and the emitted-light brightness, to realize the function of High-Dynamic Range (HDR) of the displaying device by using the technique of local dimming.

Moreover, as shown in FIG. 5, the displaying device further comprises a voltage converting assembly 33 and a power-supply managing integrated circuit 34. The voltage converting assembly 33 is configured for converting the external-power-supply voltage of 12V supplied by the input terminal of the external power supply into a power-supply voltage (Volt Current Condenser, VCC) of 3.3V, and supplying to the display panel 31 and the power-supply managing integrated circuit 34. The voltage converting assembly 33 and the time-sequence controller 32 may be arranged on the same one time-sequence controlling board. The power-supply managing integrated circuit 34 is actually a Power Management IC (PMIC), and is configured for supplying various required voltages to the display panel 31, such as a VSP voltage and a VSN voltage, wherein the VSP voltage is a positive voltage, and the VSN voltage is a negative voltage. The power-supply managing integrated circuit 34 may be arranged on a circuit board, and the circuit board is connected to the display panel 31 via a FPC connecting board 35.

In practical applications, the displaying device according to the embodiments of the present disclosure may be the instrument, the rear view mirror, and so on, in a vehicle. In this case, by using the light emitting module as the backlight module of the displaying device, by using the technique of local dimming, the HDR function of the displaying device can be realized. The HDR function can enable the frames of the displaying device to have a higher contrast, a better color expression and a clearer image quality. Therefore, the present disclosure can enable the displaying devices in a vehicle such as the instrument and the rear view mirror to have a better displaying effect, which, in environments such as night and tunnels, can improve the driving safety.

Certainly, the displaying device according to the embodiments of the present disclosure may also be any products or components that have the function of displaying such as a mobile phone, a tablet personal computer, a display, a notebook computer and a navigator.

In the embodiments of the present disclosure, by reasonably setting the quantities of the rows and the columns of the light emitting regions divided in the light emitting base plate, to cause the total quantity of the second leads in the driving assembly to be integer multiples of the column quantity of the light emitting regions, it is ensured that all of the second leads of each of the driving chips can be connected to the light emitting regions, or, in other words, it is ensured that all of the second leads of each of the driving chips are in the usage state, and none of the second leads is in an idle state, which can increase the utilization rate of the leads of the driving chips. Furthermore, as the utilization rate of the leads of the driving chips is increased, the quantity of the driving chips in the driving assembly can be correspondingly reduced, thereby reducing the cost of the light emitting module.

The above-described device embodiments are merely illustrative, wherein the units that are described as separate components may or may not be physically separate, and the components that are displayed as units may or may not be physical units; in other words, they may be located at the same one location, and may also be distributed to a plurality of network units. Part or all of the modules may be selected according to the actual demands to realize the purposes of the solutions of the embodiments. A person skilled in the art can understand and implement the technical solutions without paying creative work.

Each component embodiment of the present disclosure may be implemented by hardware, or by software modules that are operated on one or more processors, or by a combination thereof. A person skilled in the art should understand that some or all of the functions of some or all of the components of the calculating and processing device according to the embodiments of the present disclosure may be implemented by using a microprocessor or a digital signal processor (DSP) in practice. The present disclosure may also be implemented as apparatus or device programs (for example, computer programs and computer program products) for implementing part of or the whole of the method described herein. Such programs for implementing the present disclosure may be stored in a computer-readable medium, or may be in the form of one or more signals. Such signals may be downloaded from an Internet website, or provided on a carrier signal, or provided in any other forms.

Figure 7:
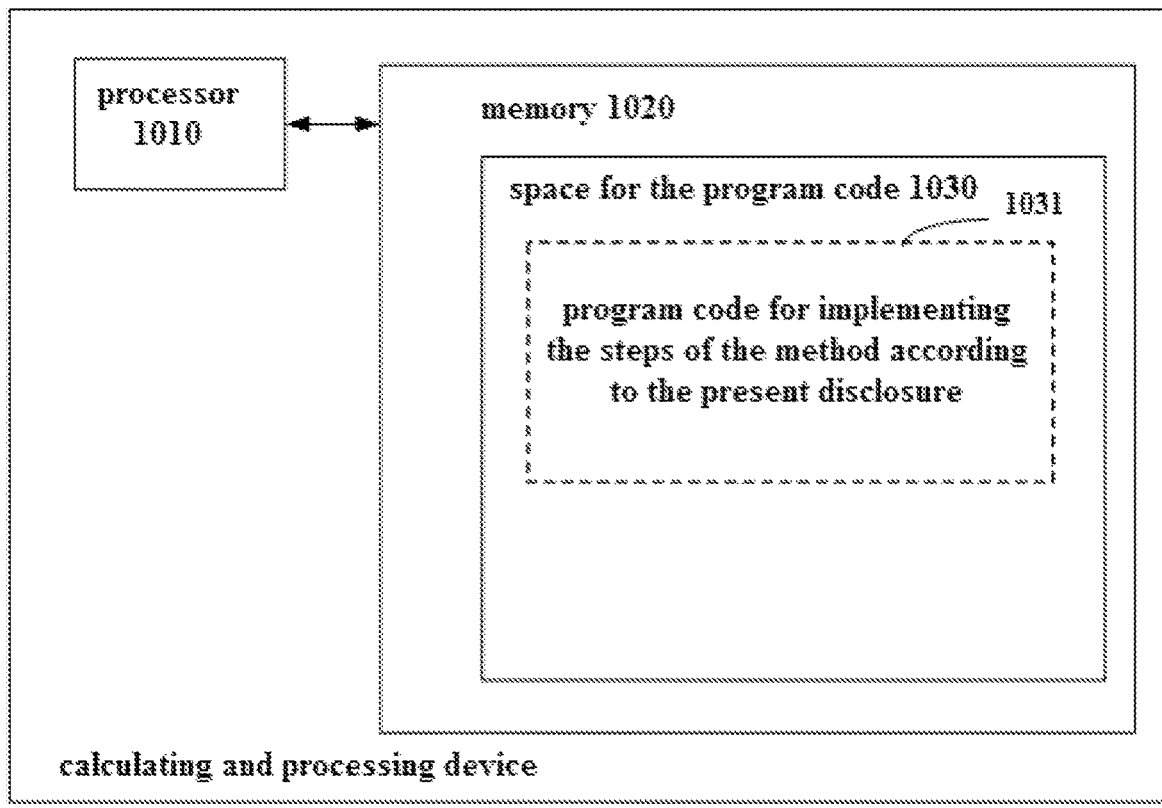
FIG. 7 schematically shows a block diagram of a calculating and processing device for implementing the method according to the present disclosure.
Figure 8:
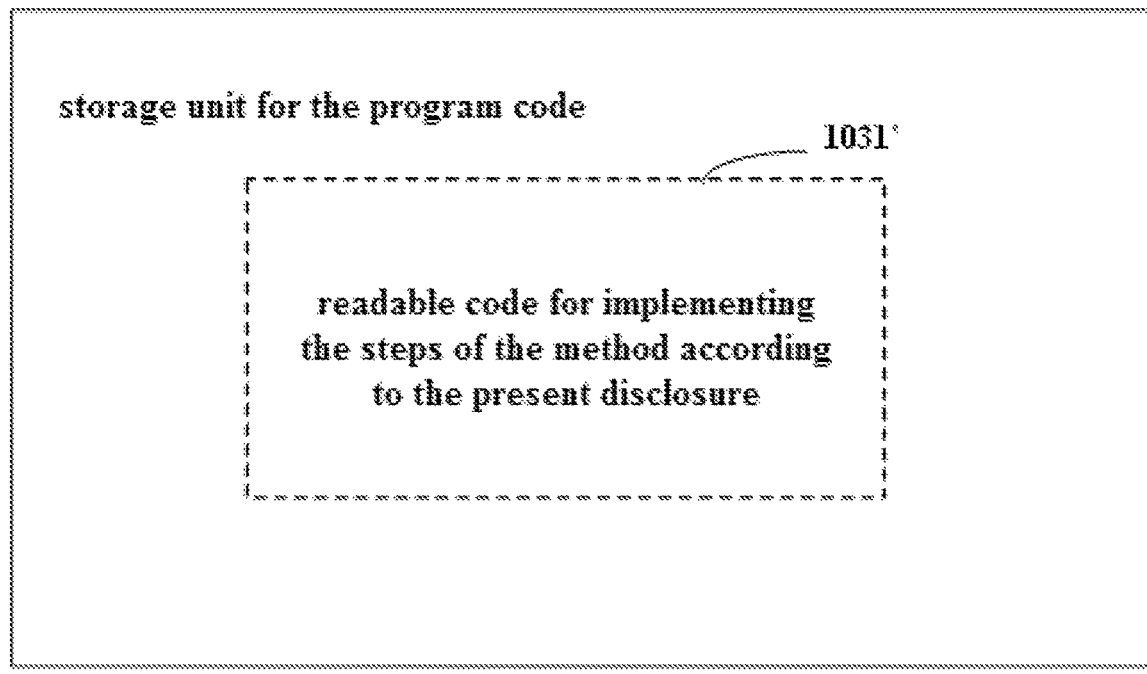
FIG. 8 schematically shows a storage unit for maintaining or carrying a program code for implementing the method according to the present disclosure.

For example, FIG. 7 shows a calculating and processing device that can implement the method according to the present disclosure. The calculating and processing device traditionally comprises a processor 1010 and a computer program product or computer-readable medium in the form of a memory 1020. The memory 1020 may be electronic memories such as flash memory, EEPROM (Electrically Erasable Programmable Read Only Memory), EPROM, hard disk or ROM. The memory 1020 has the storage space 1030 of the program code 1031 for implementing any steps of the above method. For example, the storage space 1031 for program code may contain program codes 1031 for individually implementing each of the steps of the above method. Those program codes may be read from one or more computer program products or be written into the one or more computer program products. Those computer program products include program code carriers such as hard disk, compact disk (CD), memory card or floppy disk as shown in FIG. 8. Such computer program products are usually portable or fixed storage units. The storage unit may have storage segments or storage spaces with similar arrangement to the memory 1020 of the calculating and processing device in FIG. 7. The program codes may for example be compressed in a suitable form. Generally, the storage unit contains a computer-readable code 1031', which can be read by a processor like 1010. When those codes are executed by the calculating and processing device, the codes cause the calculating and processing device to implement each of the steps of the method described above.

Regarding the above-described process embodiments, for brevity of the description, all of them are expressed as the combination of a series of actions, but a person skilled in the art should know that the present disclosure is not limited by the sequences of the actions that are described, because, according to the present disclosure, some of the steps may have other sequences or be performed simultaneously. Secondly, a person skilled in the art should also know that all of the embodiments described in the description are preferable embodiments, and not all of the actions and the modules that they involve are required by the present disclosure.

The embodiments of the description are described in the mode of progression, each of the embodiments emphatically describes the differences from the other embodiments, and the same or similar parts of the embodiments may refer to each other.

Finally, it should also be noted that, in the present text, relation terms such as first and second are merely intended to distinguish one entity or operation from another entity or operation, and that does not necessarily require or imply that those entities or operations have therebetween any such actual relation or order. Furthermore, the terms "include", "comprise" or any variants thereof are intended to cover non-exclusive inclusions, so that processes, methods, articles or devices that include a series of elements do not only include those elements, but also include other elements that are not explicitly listed, or include the elements that are inherent to such processes, methods, articles or devices. Unless further limitation is set forth, an element defined by the wording "comprising a . . . " does not exclude additional same element in the process, method, article or device comprising the element.

The light emitting module and the driving method thereof, and the displaying device according to the present disclosure have been described in detail above. The principle and the embodiments of the present disclosure are described herein with reference to the particular examples, and the description of the above embodiments is merely intended to facilitate to understand the method according to the present disclosure and its core concept. Moreover, for a person skilled in the art, according to the concept of the present disclosure, the particular embodiments and the range of application may be varied. In conclusion, the contents of the description should not be understood as limiting the present disclosure.

The invention claimed is:

1. A light emitting module, wherein the light emitting module comprises:
a light emitting base plate, wherein the light emitting base plate comprises M rows and N columns of light emitting regions, each of the light emitting regions comprises a plurality of light emitting devices that are connected in series, a first terminal of each of the light emitting regions is an anode of a first instance of the light emitting devices in the light emitting region, a second terminal of each of the light emitting regions is a cathode of a last instance of the light emitting devices in the light emitting region, and both of M and N are a positive integer greater than 1; and
a driving assembly, wherein the driving assembly comprises one or more driving chips, each of the driving chips comprises a plurality of first leads and a plurality of second leads, each of the first leads is connected to the first terminal of a corresponding one instance of the light emitting regions, and each of the second leads is connected to the second terminal of a corresponding one instance of the light emitting regions;
wherein a total quantity of the second leads in the driving assembly is integer multiples of N;
M is integer multiples of a quantity of the first leads comprised in each of the driving chips, the quantity of the first leads comprised in each of the driving chips is greater than or equal to M/8, and a product between the quantity of the first leads and a quantity of the second leads comprised in each of the driving chips is greater than or equal to (M×N)/8.

2. The light emitting module according to claim 1, wherein each of the first leads is connected to first terminals of some or all of the light emitting regions in the corresponding row, and each of the first leads corresponds to at least one row of the light emitting regions; and
each of the second leads is connected to second terminals of some or all of the light emitting regions in the corresponding column, and each of the second leads corresponds to one column of the light emitting regions.

3. The light emitting module according to claim 1, wherein the quantity of the driving chips comprised in the driving assembly is 2;
the quantity of the first leads comprised in each of the driving chips is M/2, and the quantity of the second leads comprised in each of the driving chips is 2N;
each of the first leads is connected to first terminals of all of the light emitting regions in two corresponding neighboring rows; and
each column of the light emitting regions is divided into two groups, second terminals of the light emitting regions in the same one group are connected to a same one second lead, and the second leads that are connected to the two groups of the light emitting regions are different.

4. The light emitting module according to claim 1, wherein the quantity of the driving chips comprised in the driving assembly is 4;
the quantity of the first leads comprised in each of the driving chips is M/2, and the quantity of the second leads comprised in each of the driving chips is N;
each of the first leads is connected to first terminals of all of the light emitting regions in one corresponding row; and
each column of the light emitting regions is divided into two groups, second terminals of the light emitting regions in the same one group are connected to a same one second lead, and the second leads that are connected to the two groups of the light emitting regions are different.

5. A light emitting module, the light emitting module comprises:
a light emitting base plate, wherein the light emitting base plate comprises M rows and N columns of light emitting regions, each of the light emitting regions comprises a plurality of light emitting devices that are connected in series, a first terminal of each of the light emitting regions is an anode of a first instance of the light emitting devices in the light emitting region, a second terminal of each of the light emitting regions is a cathode of a last instance of the light emitting devices in the light emitting region, and both of M and N are a positive integer greater than 1; and
a driving assembly, wherein the driving assembly comprises one or more driving chips, each of the driving chips comprises a plurality of first leads and a plurality of second leads, each of the first leads is connected to the first terminal of a corresponding one instance of the light emitting regions, and each of the second leads is connected to the second terminal of a corresponding one instance of the light emitting regions;
wherein a total quantity of the second leads in the driving assembly is integer multiples of N;

wherein the plurality of second leads comprised in each of the driving chips are classified into at least two types, different types of the second leads are connected in series to each other, and each of the second terminals of the light emitting regions is connected to any one of the second leads that are connected in series.

6. The light emitting module according to claim 5, wherein the types into which the plurality of second leads comprised in each of the driving chips are classified are related to a maximum current value required by the light emitting base plate and a current limit of each of the second leads of the driving chips.

7. The light emitting module according to claim 1, wherein the driving assembly further comprises a voltage boosting sub-assembly and a voltage dropping sub-assembly;
the voltage boosting sub-assembly is connected to an input terminal of an external power supply and the driving chips, and is configured for boosting an external-power-supply voltage supplied by the input terminal of the external power supply, to obtain a driving voltage, to supply the driving voltage to the light emitting devices in the light emitting regions via the driving chips; and
the voltage dropping sub-assembly is connected to the input terminal of the external power supply and the driving chips, and is configured for dropping the external-power-supply voltage supplied by the input terminal of the external power supply, to obtain an operating voltage, and supplying the operating voltage to the driving chips, to cause the driving chips to be in an operating state.

8. The light emitting module according to claim 7, wherein the driving assembly further comprises a controlling sub-assembly;
the controlling sub-assembly is connected to a time-sequence controller and the driving chips, and is configured for, according to a controlling signal sent by the time-sequence controller, controlling the driving chips to supply the driving voltage and a driving-current signal to the light emitting devices in the corresponding light emitting region; and
the voltage dropping sub-assembly is further connected to the controlling sub-assembly, and is configured for supplying the operating voltage to the controlling sub-assembly, to cause the controlling sub-assembly to be in an operating state.

9. The light emitting module according to claim 1, wherein the light emitting base plate comprises a glass base plate, electrode connecting lines provided on the glass base plate, and the light emitting devices connected to the electrode connecting lines; and
the electrode connecting lines are further connected to the driving chips.

10. The light emitting module according to claim 9, wherein the electrode connecting lines include anode connecting lines and cathode connecting lines, and the anode connecting lines and the cathode connecting lines are insulated from each other; and
the first terminal of each of the light emitting regions is connected to one of the anode connecting lines, the second terminal of each of the light emitting regions is connected to one of the cathode connecting lines, and all of the anode connecting lines and the cathode connecting lines are connected to the driving chips via an FPC board.

11. The light emitting module according to claim 1, wherein the light emitting devices are Mini LED devices or Micro LED devices.

12. A light-emitting-module driving method, wherein the method is for driving the light emitting module according to claim 1, and the method comprises:
determining pixel data of pixel units in displaying sub-regions corresponding to each of the light emitting regions; and
according to the pixel data, sending a controlling signal to the driving chips, to control the light emitting devices in each of the light emitting regions with respect to whether to emit light and an emitted-light brightness.

13. A calculating and processing device, wherein the calculating and processing device comprises:
a memory storing a computer-readable code; and
one or more processors, wherein when the computer-readable code is executed by the one or more processors, the calculating and processing device implements the light-emitting-module driving method according to claim 12.

14. A displaying device, wherein the displaying device comprises the light emitting module according to claim 1.

15. The displaying device according to claim 14, wherein the displaying device further comprises a display panel and a time-sequence controller, and the display panel is located on a light exiting side of the light emitting module; and
the time-sequence controller is connected to the display panel and the light emitting module.

* * * * *